United States Patent [19]
Tanigami et al.

[11] Patent Number: 6,069,041
[45] Date of Patent: May 30, 2000

[54] PROCESS FOR MANUFACTURING NON-VOLATILE SEMICONDUCTOR MEMORY DEVICE BY INTRODUCING NITROGEN ATOMS

[75] Inventors: Takuji Tanigami, Kitakatsuragi-gun; Shinichi Sato, Nara; Kenichi Azuma, Tenri, all of Japan

[73] Assignee: Sharp Kabushiki Kaisha, Osaka, Japan

[21] Appl. No.: 08/974,158

[22] Filed: Nov. 19, 1997

[30] Foreign Application Priority Data

Nov. 27, 1996  [JP]  Japan ................................ 8-315769

[51] Int. Cl.[7] ........................................... H01L 21/8247
[52] U.S. Cl. ........................ 438/261; 438/264; 438/528; 438/910
[58] Field of Search .................................. 438/261, 264, 438/528, 532, 766, 910, 591

[56] References Cited

U.S. PATENT DOCUMENTS

| | | | |
|---|---|---|---|
| 4,774,197 | 9/1988 | Haddad et al. | 438/766 |
| 5,464,792 | 11/1995 | Tseng et al. | 438/910 |
| 5,571,734 | 11/1996 | Tseng et al. | 438/591 |
| 5,837,585 | 11/1998 | Wu et al. | 438/264 |

FOREIGN PATENT DOCUMENTS

| | | |
|---|---|---|
| 5-267684 | 10/1993 | Japan . |
| 6-29314 | 2/1994 | Japan . |
| 6-77493 | 3/1994 | Japan . |

OTHER PUBLICATIONS

T. Kuroi, et al., 1994, Symposium on VLSI Technology Digest of Technical Papers, "*The Effects of Nitrogen Implantation of into P Poly–Silicon Gate on Gate Oxide Properties*", pp. 107–108.

*Primary Examiner*—Chandra Chaudhari
*Attorney, Agent, or Firm*—Nixon & Vanderhye P.C.

[57] ABSTRACT

A process for manufacturing a non-volatile semiconductor memory device by forming a tunnel dielectric film, a floating gate electrode, an interlayer capacitive film and a control gate electrode successively on a semiconductor substrate includes introducing nitrogen atoms into at least one of an interface between the floating gate electrode and the interlayer capacitive film and an interface between the interlayer capacitive film and the control gate electrode.

4 Claims, 12 Drawing Sheets

PROCESS FOR MANUFACTURING NON-VOLATILE SEMICONDUCTOR MEMORY DEVICE BY INTRODUCING NITROGEN ATOMS

CROSS-REFERENCES TO RELATED APPLICATIONS

This application is related to Japanese Patent Application No. HEI 8(1996)-315769, filed on Nov. 27, 1996 whose priority is claimed under 35 USC §119, the disclosure of which is incorporated herein by reference in its entirety.

BACKGROUND OF THE INVENTION

1. Field of the Invention

The present invention relates to a process for manufacturing a non-volatile semiconductor memory device. More particularly, the present invention relates to a process for manufacturing a non-volatile semiconductor memory device comprising memory cells having a tunnel dielectric film, a floating gate electrode, a control gate electrode and an interlayer capacitive film formed between the floating gate electrode and the control gate electrode.

2. Description of the Related Arts

With reference to FIG. 7 to FIG. 12(b), an explanation is given on a general process for manufacturing a non-volatile semiconductor memory device in which memory cells having a floating gate electrode and a control gate electrode are formed on a semiconductor substrate.

FIG. 7 is a plan view of a memory cell portion, in which the dotted line represents an interface between an active region and a device isolation region; CG represents a control gate electrode region; and FG represents a floating gate electrode region. FIGS. 8(a) to 12(b) show a prior art process for manufacturing a memory cell portion. In FIG. 8(a) to FIGS. 12(b), (a) represents an X-X' cross section of FIG. 7, and (b) represents a Y'-Y cross section of FIG. 7.

First, a device isolation region 22 comprising a silicon oxide film of 500 nm and an active region 23 are formed on a P-type semiconductor substrate 21 by LOCOS method. Thereafter, a tunnel oxide film 24 is formed to a thickness of about 10 nm on the active region 23 by thermal oxidation, and then a polysilicon film 25 doped with phosphorus as an impurity is deposited to a thickness of about 100 nm as a material for a floating gate electrode.

Subsequently, the polysilicon film 25 is patterned by reactive ion etching using, as a mask, a resist R11 patterned by means of photolithography so as to form the floating gate electrode, as shown in FIGS. 8(a) and 8(b).

After the resist R11 is removed, an ONO film (a three-layer film of first silicon oxide film 26 ($SiO_2$)/silicon nitride film 27 (SiN)/second silicon oxide film 28 ($SiO_2$)) is formed as an interlayer capacitive film between the floating gate electrode and the control gate electrode, as shown in FIGS. 9(a) and 9(b). Namely, a first silicon oxide film 26 is formed to a thickness of 8 nm on a surface of the floating gate electrode by thermal oxidation method; then a silicon nitride film 27 is formed to a thickness of 20 nm by CVD (Chemical Vapor Deposition) method; and further a second silicon oxide film 28 is formed to a thickness of 8 nm, successively. After the ONO film is formed, a polycide film 29 is deposited to a thickness of about 100 nm as a material for the control gate electrode.

Then, the polycide film 29 is patterned by reactive ion etching using, as a mask, a resist R22 patterned by means of photolithography so as to form the control gate electrode, as shown in FIGS. 10(a) and 10(b). Namely, the polycide film 29 as a material for the control gate electrode, the ONO film, and the polysilicon film 25 as a material for the floating gate electrode are successively removed by etching.

Further, after the resist R22 is removed, a side wall of the polysilicon film 25 as a material for the floating gate electrode is covered with a thermal oxide film 30 as shown in FIGS. 11(a) and 11(b), since the side wall of the polysilicon film 25 is exposed during the patterning of the polycide film 29 for the control gate electrode. Thereafter, as shown in FIGS. 12(a) and 12(b), an impurity is implanted with the control gate electrode used as a mask to form source/drain regions 31, and an interlayer dielectric film 32 is deposited.

According to the above prior art process, the side wall of the polysilicon film as a material for the floating gate must be covered with a thermal oxide film, since the side wall of the polycrystalline film is exposed during the patterning of the polycide film 29 for the control gate electrode. At this time, in the case where the interlayer capacitive film is formed of an ONO film, oxidation to the floating gate electrode and the control gate electrode proceeds from the interface between the first silicon oxide film 26 and the floating gate electrode, and from the interface between the second silicon oxide film 28 and the control gate electrode, respectively. This causes portions 26a and 28a of the ONO film adjacent the exposed side surface of the polysilicon film to be thickened, as shown in FIGS. 11(a) and 11(b).

This partial thickening of the ONO film reduces the ratio (coupling ratio) of the potential difference between the floating gate electrode and the substrate relative to the potential difference between the control gate electrode and the substrate, thereby decreasing the efficiency of performing writing and erasing operations to the floating gate electrode by use of electrons.

Further, as shown in FIGS. 11(a) and 11(b), the oxidation proceeds also to the floating gate electrode from the interface between the tunnel dielectric film and the floating gate electrode as well as to the interfaces of the interlayer capacitive film, thereby thickening a portion 24a of the tunnel oxide film adjacent the exposed side surface of the polysilicon film 25.

Therefore, in performing writing/erasing operations by means of an FN current, the electric field strength between the floating gate electrode and the diffusion layers (source/drain) decreases due to the partial thickening of the tunnel dielectric film, whereby the FN current decreases and the writing/erasing efficiency is lowered.

In order to solve this problem, Japanese Unexamined Patent Publication (Kokai) No. HEI 6(1994)-77493 provides that a side wall of nitride film is formed on a side surface of the gate electrodes. However, this is accompanied by a drawback that the process is complicated, and moreover it is not suited for size reduction of the memory cells because the side wall of nitride film protrudes over the source/drain regions. Also, since the side surface of the gate electrodes must be covered with a highly dielectric thermal oxide film before the side wall of nitride film is formed, it is not possible to prevent creation of a bird's beak in forming the thermal oxide film.

Further, Japanese Unexamined Patent Publication (Kokai) HEI 5(1993)-267684 proposes an NONO film. However, this is accompanied by a drawback that, since the control gate electrode is in contact with the oxide film, oxidation proceeds to the control gate electrode, creating a bird's beak.

SUMMARY OF THE INVENTION

The present invention provides a process for manufacturing a non-volatile semiconductor memory device by forming a tunnel dielectric film, a floating gate electrode, an interlayer capacitive film and a control gate electrode successively on a semiconductor substrate, wherein the process comprises introducing nitrogen atoms into at least one of an interface between the semiconductor substrate and the tunnel dielectric film, an interface between the tunnel dielectric film and the floating gate electrode, an interface between the floating gate electrode and the interlayer capacitive film and an interface between the interlayer capacitive film and the control gate electrode.

Namely, the purpose of the present invention is to provide means for preventing the thickening of interlayer capacitive film adjacent an exposed side surface of polysilicon film and the thickening of tunnel oxide film.

DETAILED DESCRIPTION OF THE PREFERRED EMBODIMENTS

Figure 1:
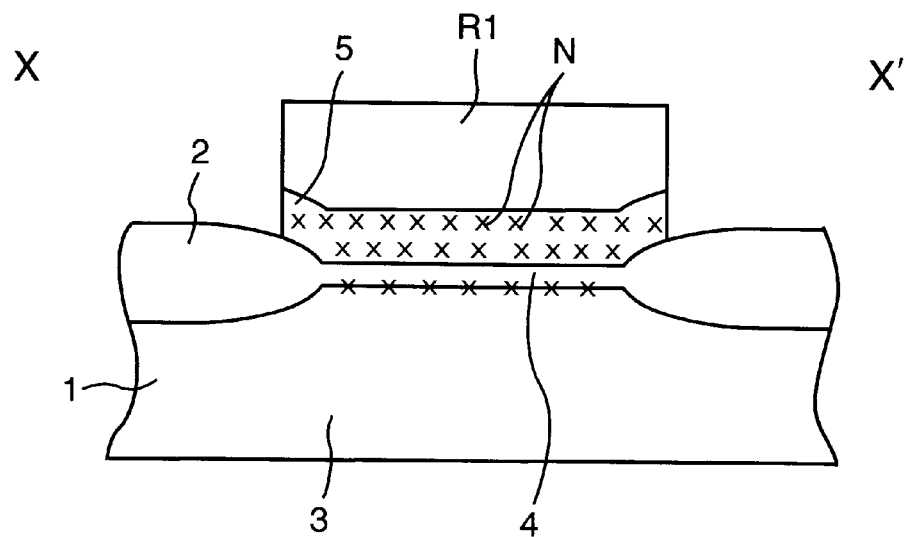
FIGS. 1(a) and 1(b) are views showing a cross section of an essential part of a process for manufacturing a non-volatile semiconductor memory device according to a first embodiment of the present invention.
Figure 1:
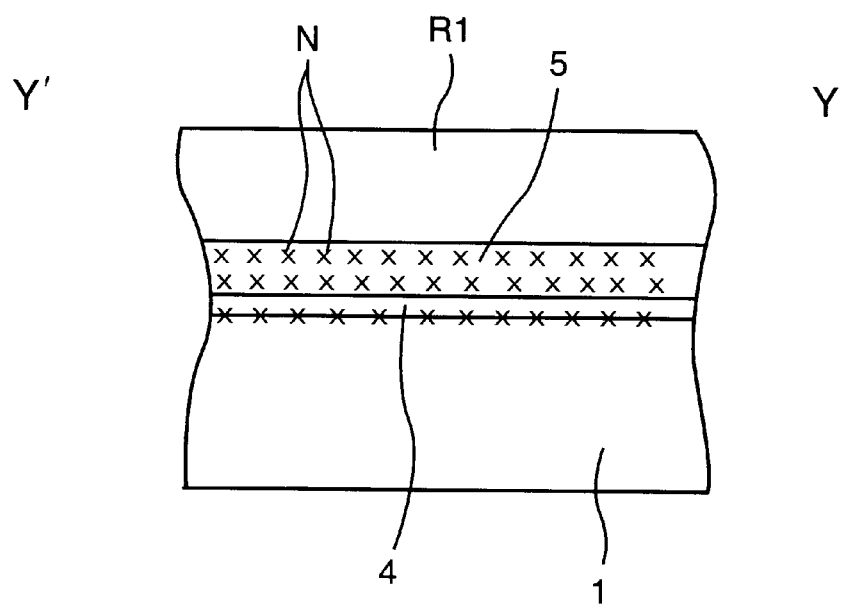
Figure 2:
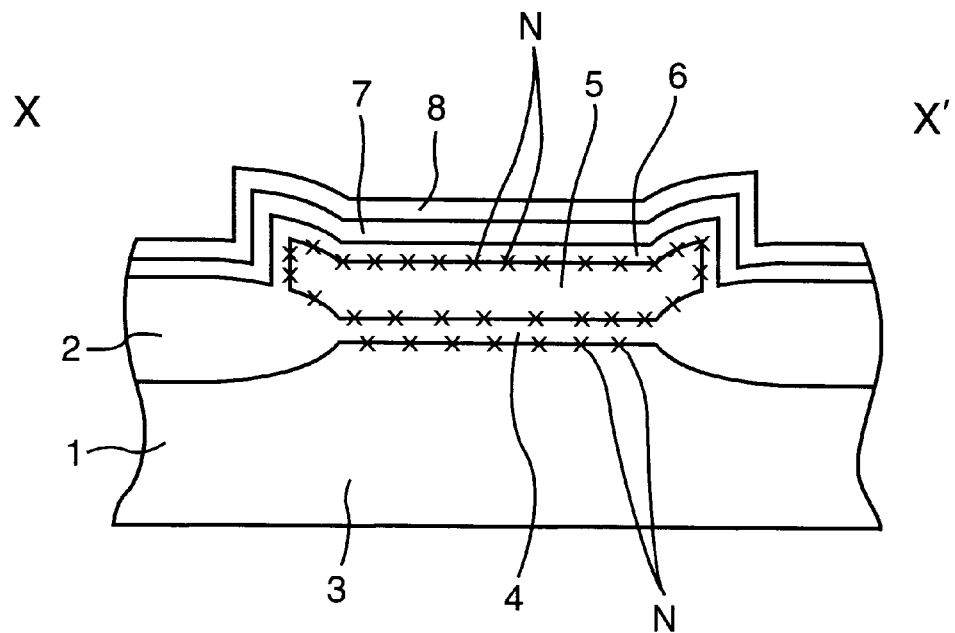
FIGS. 2(a) and 2(b) are views showing the cross section of the essential part of the process for manufacturing the non-volatile semiconductor memory device according to the first embodiment of the present invention.
Figure 2:
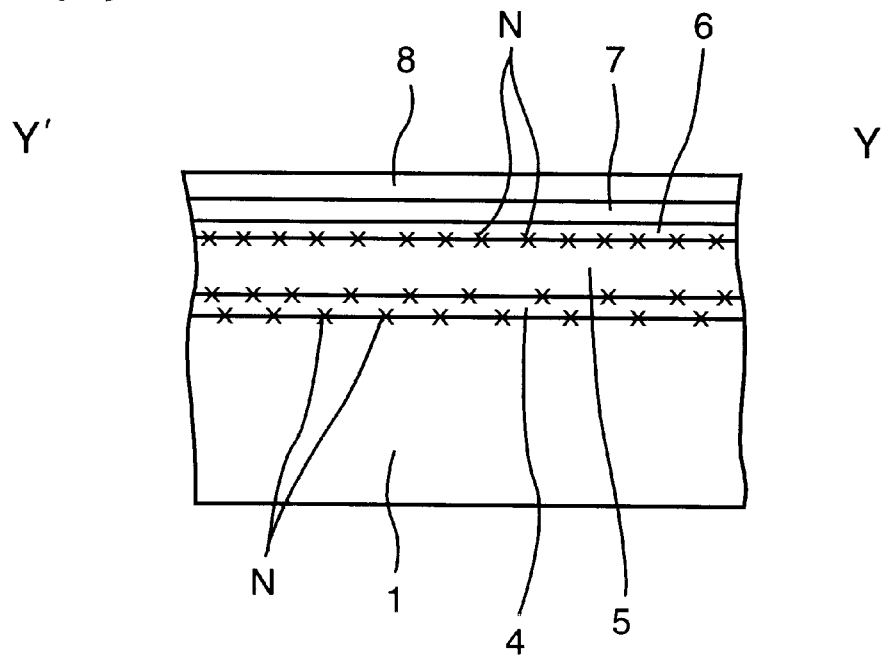
Figure 3:
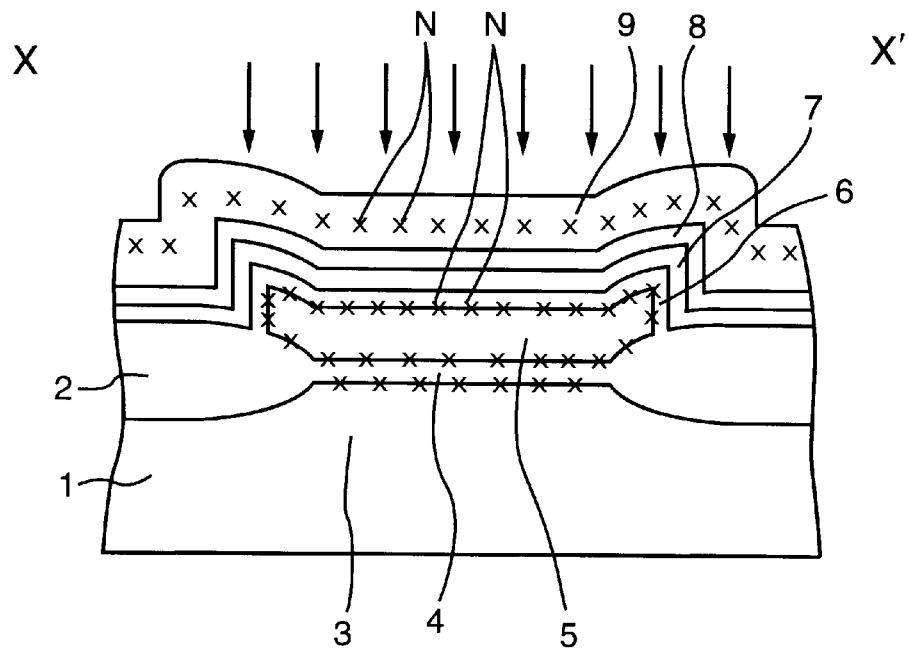
FIGS. 3(a) and 3(b) are views showing the cross section of the essential part of the process for manufacturing the non-volatile semiconductor memory device according to the first embodiment of the present invention.
Figure 3:
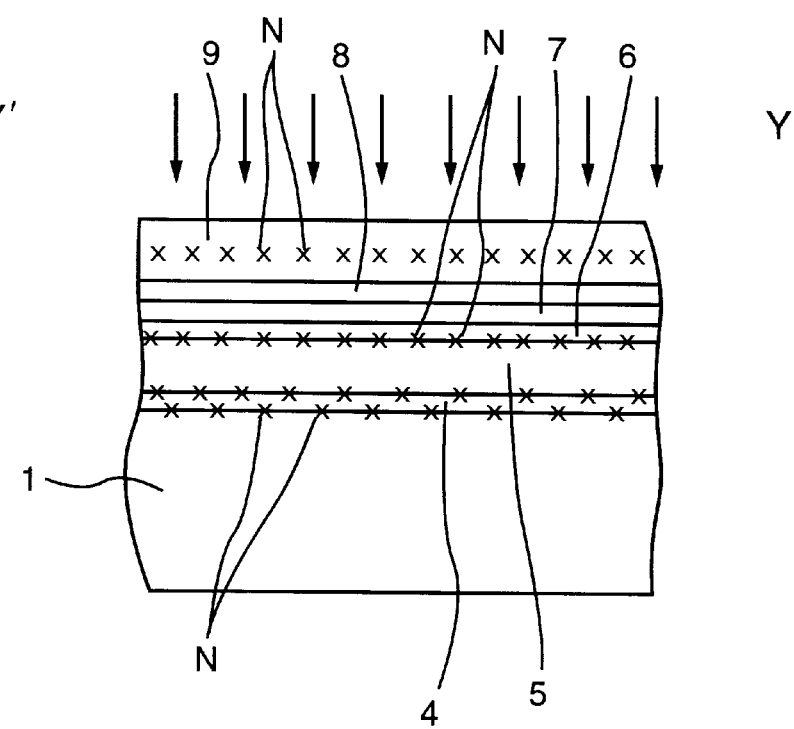
Figure 4:
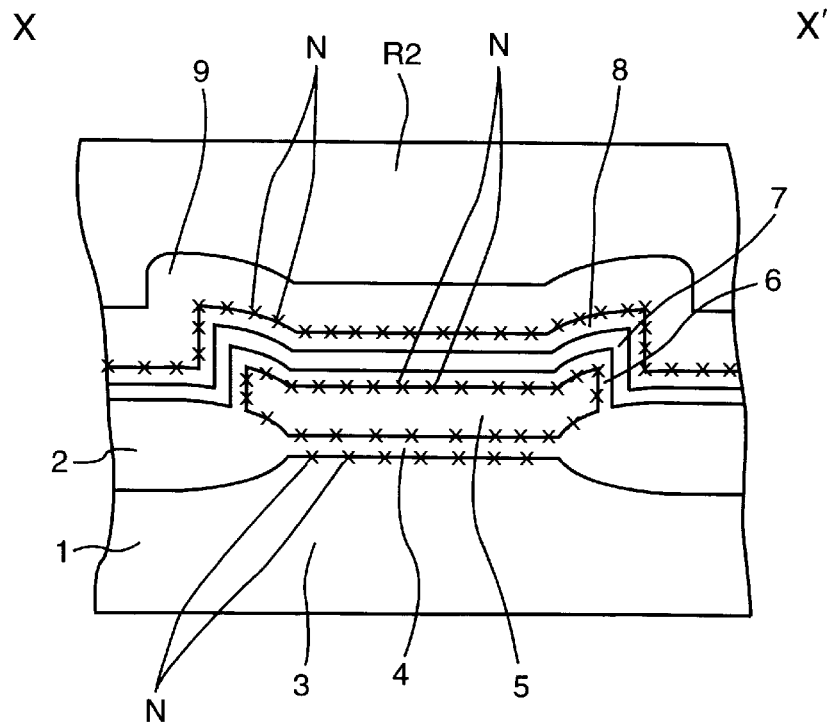
FIGS. 4(a) and 4(b) are views showing the cross section of the essential part of the process for manufacturing the non-volatile semiconductor memory device according to the first embodiment of the present invention.
Figure 4:
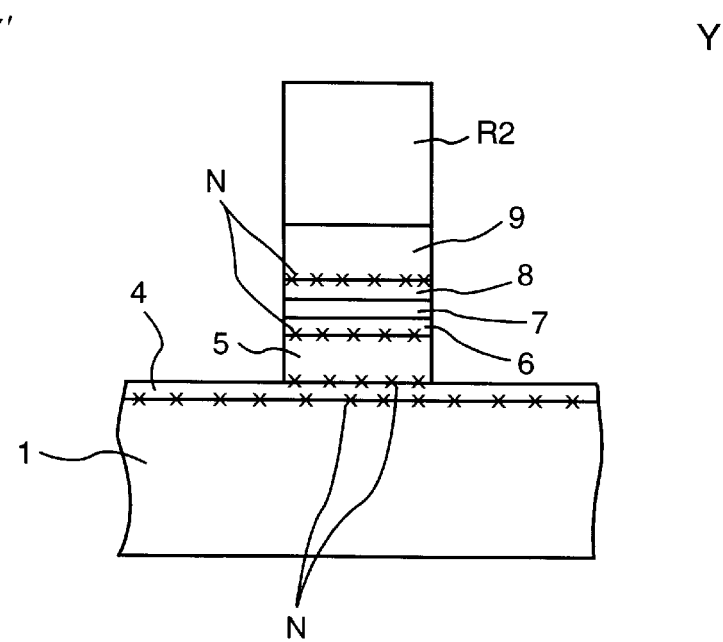
Figure 5:
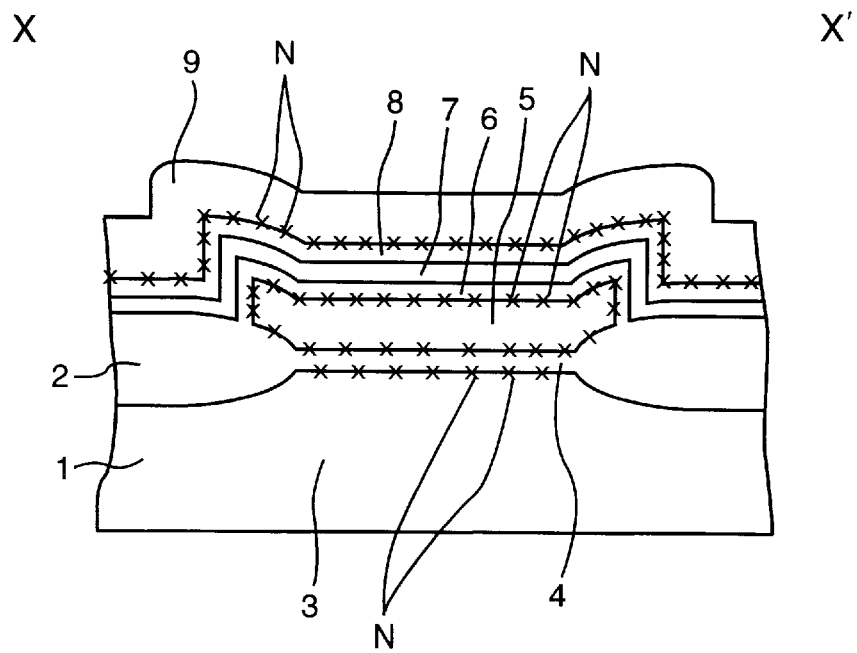
FIGS. 5(a) and 5(b) are views showing the cross section of the essential part of the process for manufacturing the non-volatile semiconductor memory device according to the first embodiment of the present invention.
Figure 5:
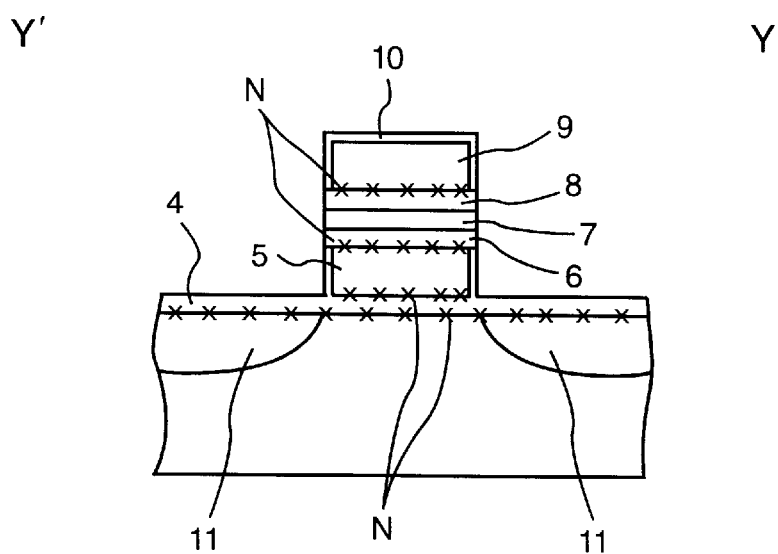
Figure 6:
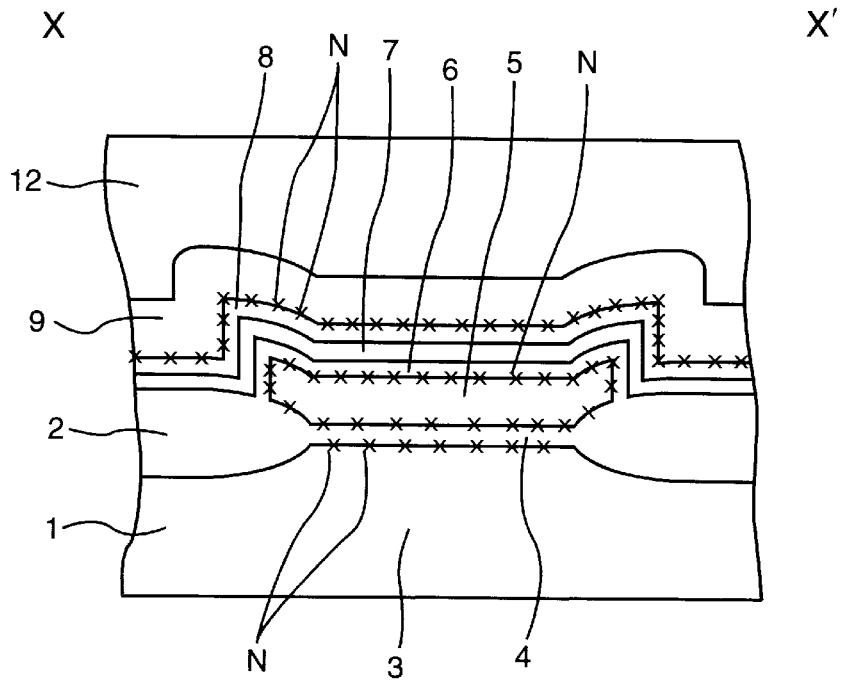
FIGS. 6(a) and 6(b) are views showing the cross section of the essential part of the process for manufacturing the non-volatile semiconductor memory device according to the first embodiment of the present invention.
Figure 6:
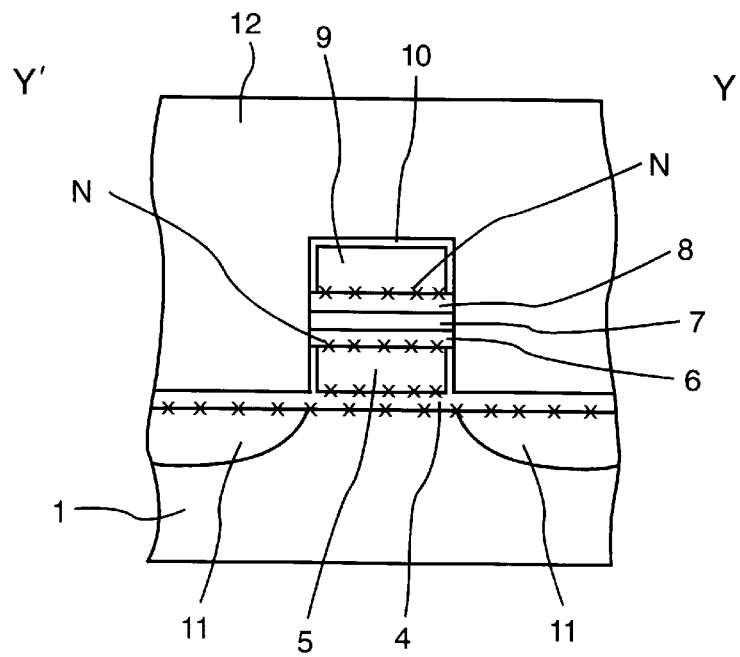

The present invention mainly relates to a process for manufacturing a non-volatile semiconductor memory device comprising a tunnel dielectric film, a floating gate electrode, an interlayer capacitive film and a control gate electrode formed in this order on a semiconductor substrate, wherein the process includes introducing nitrogen atoms into an interface between the semiconductor substrate and the tunnel dielectric film, into an interface between the tunnel dielectric film and the floating gate electrode, into an interface between the floating gate electrode and an interlayer capacitive film or into an interface between the interlayer capacitive film and the control gate electrode, or into two or more of the above interfaces.

The semiconductor substrate to be used in the present invention may be formed of silicon, germanium, a compound semiconductor such as GaAs or InGaAs, or the like semiconductor, among which silicon substrate is preferably used. A device isolation film such as a LOCOS film may be formed to a thickness of about 300 to about 2000 nm on the silicon substrate.

The material for the tunnel dielectric film is not specifically limited as long as it is a dielectric film. However, the tunnel dielectric film is preferably formed of silicon oxide film or the like, where the thickness of the film may be for example about 5 to about 30 nm.

The tunnel dielectric film may be formed by a known method, for example, by CVD method or a thermal oxidation method in which the surface of the semiconductor substrate is thermally treated under an oxygen atmosphere at a temperature of about 700 to about 1200° C.

In the case where nitrogen atoms are to be introduced into the interface between the semiconductor substrate and the tunnel dielectric film (and/or the interface between the tunnel dielectric film and the later-mentioned floating gate electrode), the introduction of nitrogen atoms may be achieved for example by forming the tunnel dielectric film on the semiconductor substrate to a desired thickness using the above method and then carrying out a thermal treatment under an atmosphere containing nitrogen atoms at a temperature in the range of about 700 to about 1200° C. The atmosphere containing nitrogen atoms referred to herein may be for example a nitrogen atmosphere containing $N_2$ gas or an ammonia nitrogen atmosphere containing ammonia gas. The thermal treatment is preferably carried out in accordance with the thickness of the tunnel dielectric film.

Alternatively, the CVD method or the thermal oxidation method may be carried out under an oxidizing atmosphere containing nitrogen, for example, under an $N_2O$ gas atmosphere.

Still alternatively, after a tunnel dielectric film is formed on the semiconductor substrate to a desired thickness by the above method, ion implantation may be carried out with the implantation energy being adjusted in accordance with the thickness of the obtained tunnel dielectric film.

Through one of these methods, nitrogen atoms are introduced finally into the interface between the semiconductor substrate and the tunnel dielectric film (and/or the interface between the tunnel dielectric film and the later-mentioned floating gate electrode).

The material for the floating gate electrode is not specifically limited as long as it can be formed into an electrode. For example, the floating gate electrode is preferably formed of polysilicon film doped with an N-type impurity such as phosphorus or arsenic, or a P-type impurity such as boron at a concentration of about $1.0 \times 10^{19}$ to about $1.0 \times 10^{20}$ cm$^{-3}$, a silicide or a polycide of such polysilicon film with a high melting point metal such as W, Ta, Ti, or the like material. The thickness of the floating gate electrode is preferably about 80 to 350 nm.

If the material for the floating gate electrode is polysilicon, it may be formed by a known method such as CVD method using a silane gas or the like; and if the material is a metal film, it may be formed by a known method such as an EB method, a sputtering method, a vacuum vapor deposition method or the like.

In the case where nitrogen atoms are to be introduced into the interface between the tunnel dielectric film and the floating gate electrode, and/or the interface between the floating gate electrode and the later-mentioned interlayer capacitive film, the nitrogen atoms may be introduced, for example, by impurity diffusion or ion implantation into the floating gate electrode material after the floating gate electrode material is deposited to a desired thickness by the above method. Specifically, in the case of ion implantation, the dosage is preferably about $1.0 \times 10^{19}$ to about $1.0 \times 10^{20}$ cm$^{-3}$ with the implantation energy being suitably adjusted in accordance with the thickness of the floating gate electrode.

After the introduction of nitrogen atoms, a thermal treatment is carried out. The thermal treatment at this time may be carried out by a known method such as RTA (Rapid Thermal Annealing), a $N_2O$ nitrided dielectrics grown method, or the like under an ordinary atmosphere at a temperature of about 700 to about 1200° C. Here, if another thermal treatment is to be carried out at a later step, it is possible to utilize it for carrying out the above-mentioned thermal treatment.

Through these steps, nitrogen atoms are introduced finally into the interface between the tunnel dielectric film and the floating gate electrode and/or the interface between the floating gate electrode and the later-mentioned interlayer capacitive film.

The electrode material into which nitrogen atoms are introduced may be patterned into a desired shape by a known method such as photolithography and etching. Alternatively, the patterning may be carried out before the introduction of nitrogen atoms into the electrode material.

The material for the interlayer capacitive film is not specifically limited as long as it is a material having a dielectric constant of more than a predetermined value. The interlayer capacitive film may be formed of a monolayer of a dielectric film such as $SiO_2$, SiN, ONO ($SiO_2$/SiN/$SiO_2$) film, or ONON film, a ferroelectric film such as PZT or PLZT, or a laminated layer film thereof. Among these, an ONO film is preferable. The thickness of the interlayer capacitive film is preferably about 30 to about 100 nm and, in the case of ONO film, it is preferably about 5 to about 30 nm/about 10 to about 50 nm/about 5 to about 30 nm.

The interlayer capacitive film may be formed by a known method such as a CVD method, a thermal oxidation method, an MOCVD method, a sol-gel method, or the like.

In the case where nitrogen atoms are to be introduced into the interface between the floating gate electrode and the interlayer capacitive film (and/or the interface between the interlayer capacitive film and the later-mentioned control gate electrode), the introduction may be achieved by forming an interlayer capacitive film having nitrogen atoms as mentioned above on the floating gate electrode. Specifically, in the case where the interlayer capacitive film is an ONO film, nitrogen atoms are introduced into the interlayer capacitive film by first forming an oxide film by a process similar to the above-mentioned method for introducing nitrogen into the tunnel dielectric film, then forming a nitride film thereon by a known method, and further forming an oxide film thereon by a process similar to the above-mentioned method for introducing nitrogen into the tunnel dielectric film. In this case, nitrogen may be introduced into only one of the lower oxide film and the upper oxide film.

If the interlayer capacitive film is a monolayer film formed of a material liable to be oxidized during the process or a laminated layer film including a material film liable to be oxidized, it is preferable to introduce nitrogen atoms into the material which is liable to be oxidized.

Through these steps, nitrogen atoms are introduced finally into the interface between the floating gate electrode and the interlayer capacitive film (and/or the interface between the interlayer capacitive film and the later-mentioned control gate electrode).

The control gate electrode may be formed of a material similar to the one for the floating gate electrode in a similar manner. In the case where nitrogen atoms are to be introduced into the interface between the interlayer capacitive film and the control gate electrode, it may be achieved by introduction of nitrogen atoms by a method similar to the one for the floating gate electrode. Through these steps, nitrogen atoms are introduced finally into the interface between the interlayer capacitive film and the control gate electrode.

After the introduction of nitrogen atoms, a thermal treatment is carried out. The thermal treatment may be achieved similar to the above-mentioned method.

The present invention is now explained in detail by way of embodiments with reference to the attached drawings.

Figure 7:
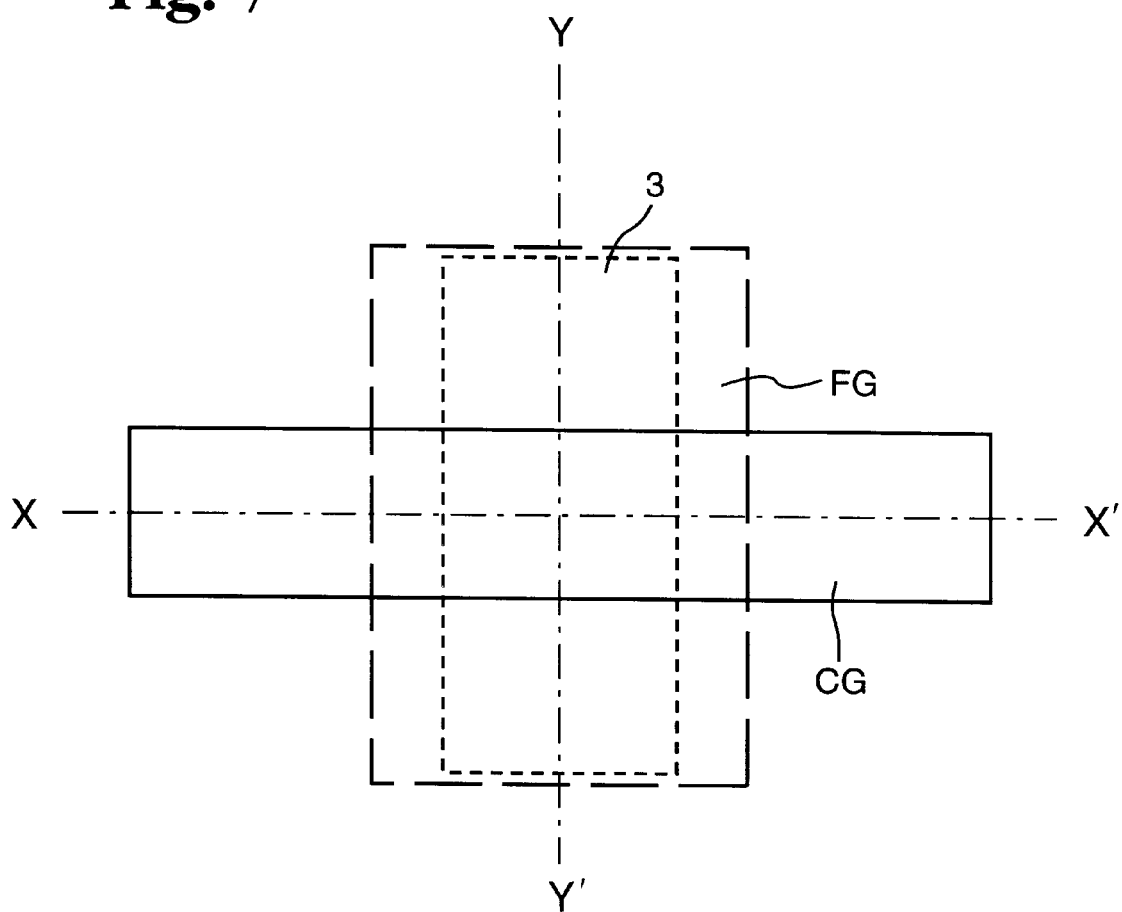
FIG. 7 is a plan view of a memory cell portion of a non-volatile semiconductor memory device.
Figure 8:
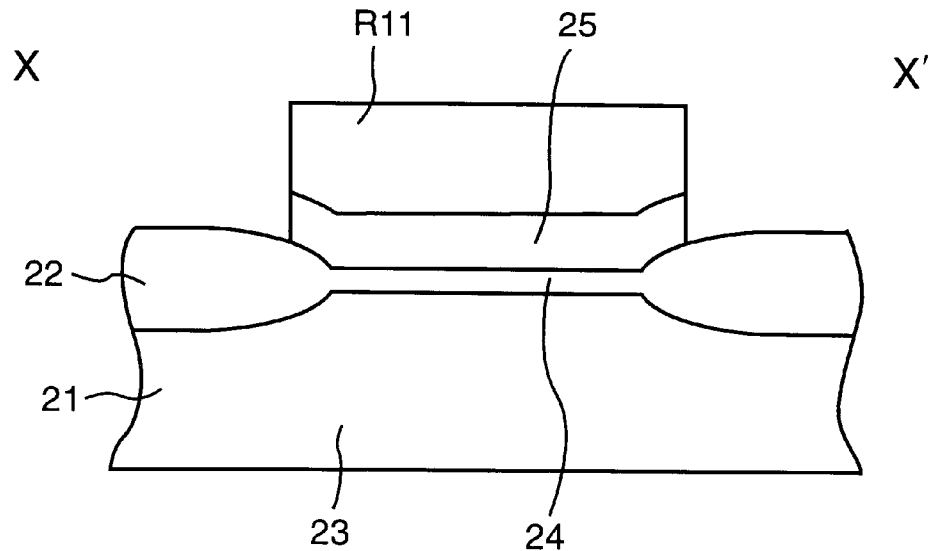
FIGS. 8(a) and 8(b) are views showing a cross section of an essential part of a prior art process for manufacturing a non-volatile semiconductor memory device.
Figure 8:
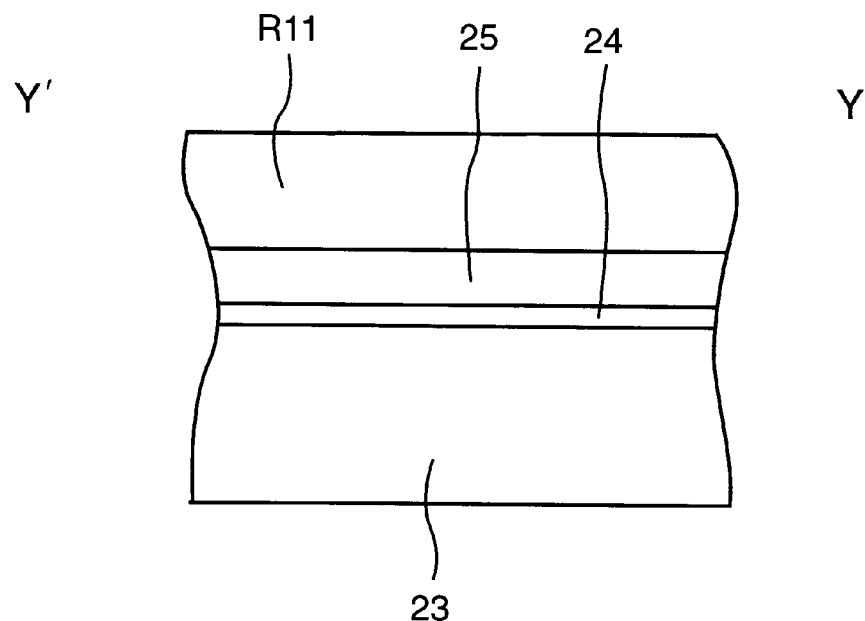
Figure 9:
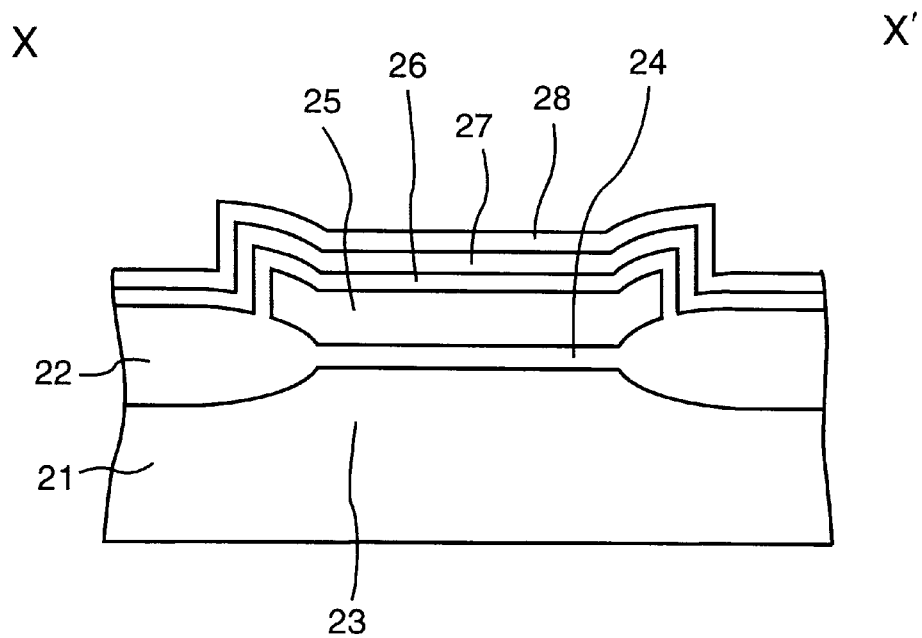
FIGS. 9(a) and 9(b) are views showing the cross section of the essential part of the prior art process for manufacturing the non-volatile semiconductor memory device.
Figure 9:
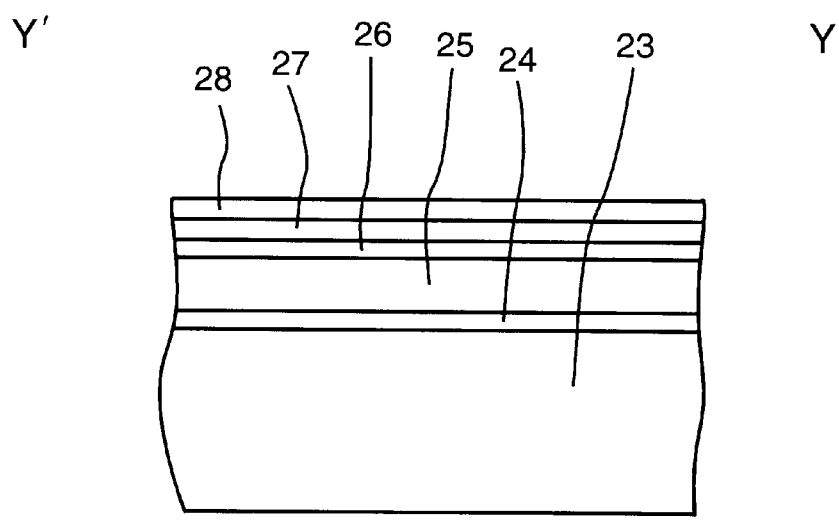
Figure 10:
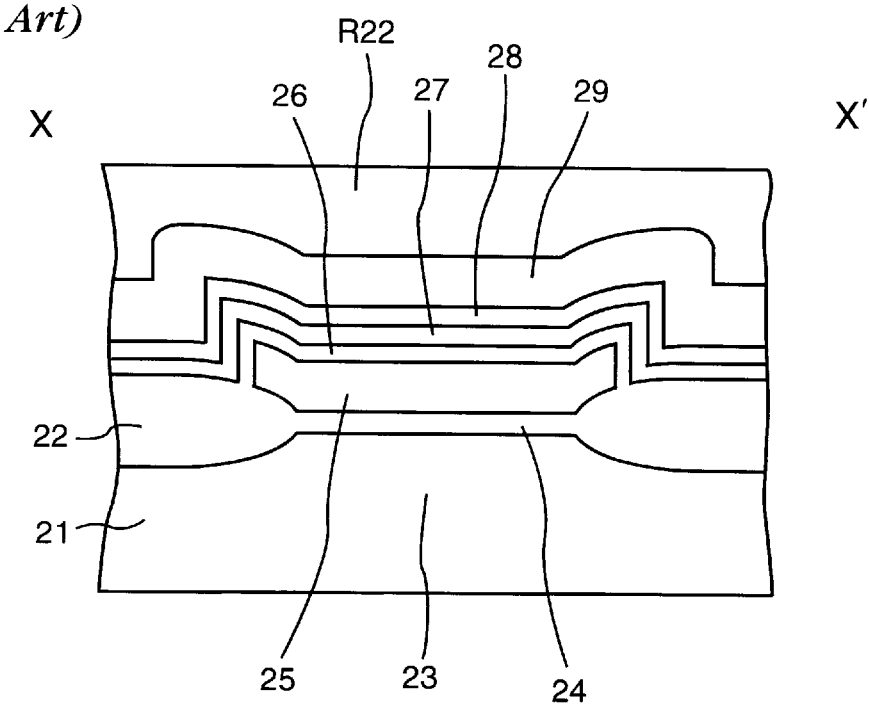
FIGS. 10(a) and 10(b) are views showing the cross section of the essential part of the prior art process for manufacturing the non-volatile semiconductor memory device.
Figure 10:
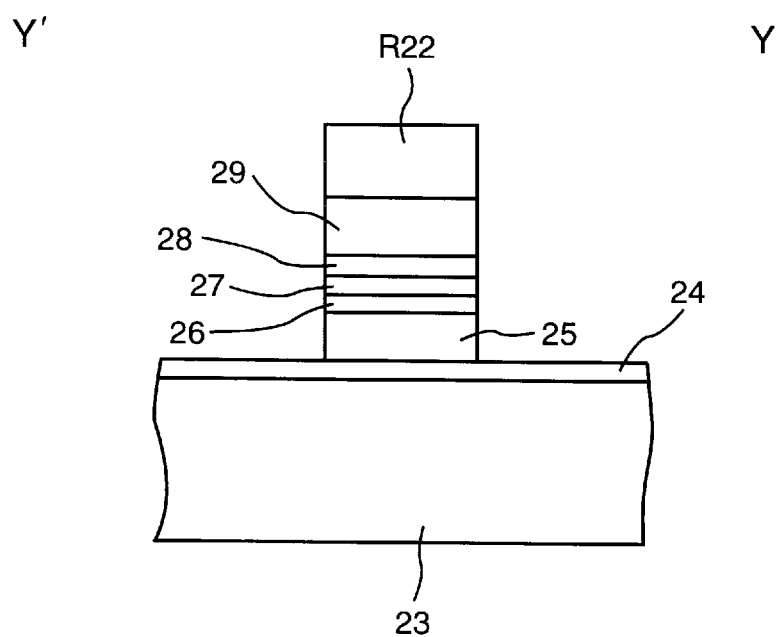
Figure 11:
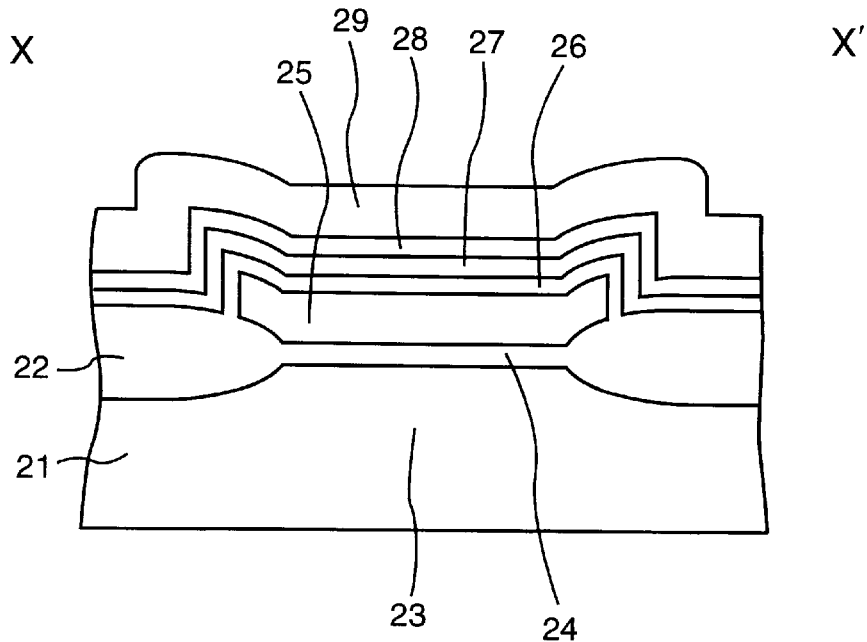
FIGS. 11(a) and 11(b) are views showing the cross section of the essential part of the prior art process for manufacturing the non-volatile semiconductor memory device.
Figure 11:
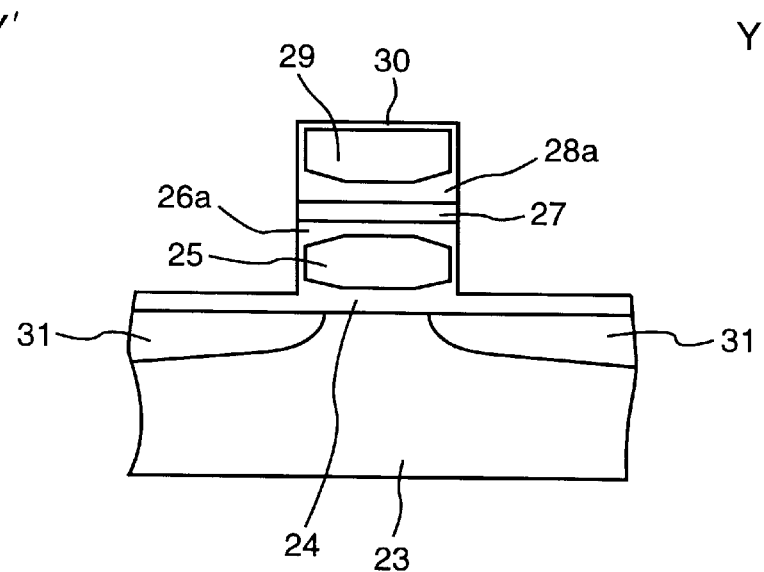
Figure 12:
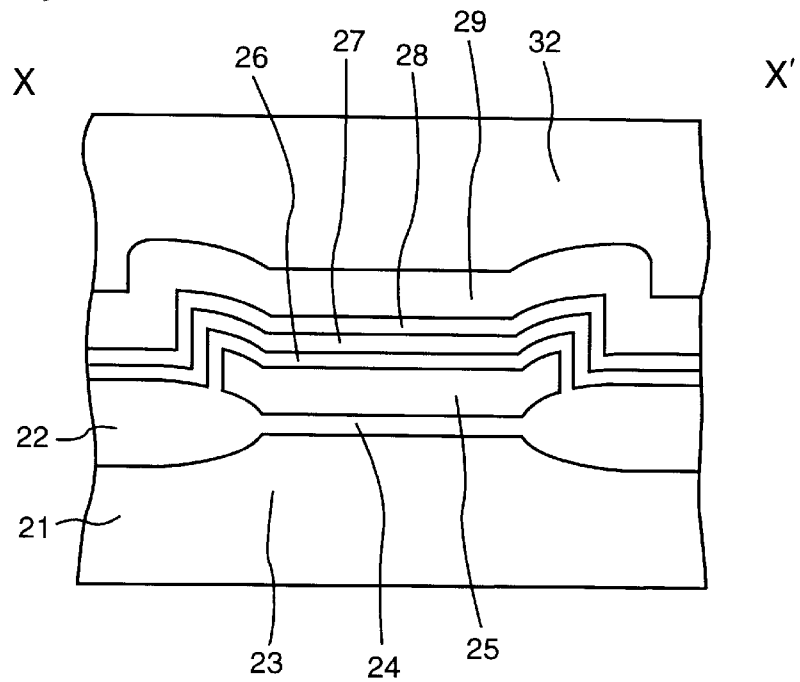
FIGS. 12(a) and 12(b) are views showing the cross section of the essential part of the prior art process for manufacturing the non-volatile semiconductor memory device.
Figure 12:
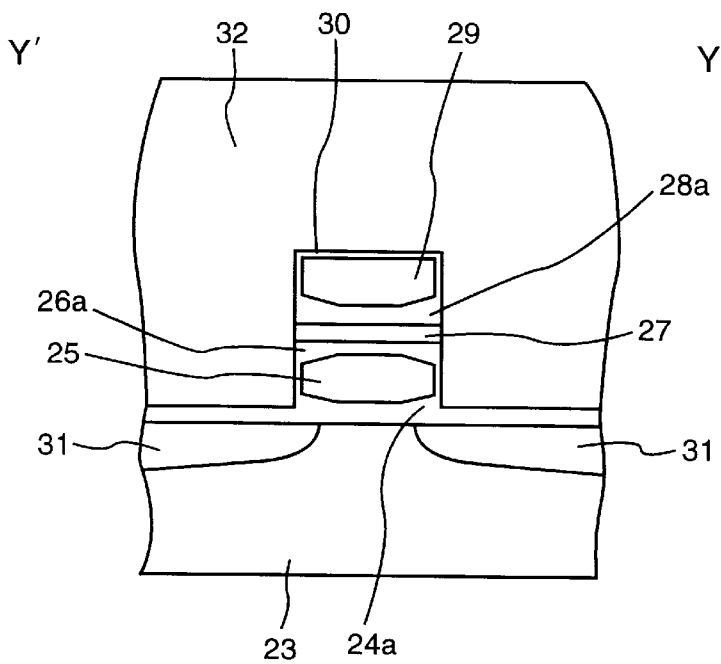

The plan view of a memory cell portion according to the present invention is the same as the one shown in FIG. 7.

FIGS. 1(a) to 6(b) are views showing a cross section of an essential part of a process for manufacturing a non-volatile semiconductor memory device according to an embodiment of the present invention.

Embodiment 1

With reference to FIGS. 1(a) to 6(b), a process for manufacturing a non-volatile semiconductor memory device according to the first embodiment of the present invention is hereafter described in detail.

First, a device isolation region 2 and an active region 3 are formed of silicon oxide film to a thickness of 500 nm on a P-type semiconductor substrate 1 by LOCOS method. Then, after a thermal oxide film is formed to a desired thickness in an oxygen atmosphere at a temperature of about 800 to about 900° C., a tunnel oxide film 4 is formed to a thickness of about 10 nm while allowing the surface of the semiconductor substrate 1 on the active region 3 to contain nitrogen by carrying out a thermal treatment under $N_2$ atmosphere at a temperature of about 800 to about 900° C. Thereafter, a polysilicon film 5 doped with phosphorus as an impurity is deposited to a thickness of about 100 nm as a material for a floating gate electrode.

Then, nitrogen is implanted into the polysilicon film 5 at an implantation energy of 20 keV and in a dosage of about $4 \times 10^{15}$ cm$^{-2}$. Further, the material for the floating gate electrode is etched by reactive ion etching by using, as a mask, a resist R1 patterned by means of photolithography, as shown in FIGS. 1(a) and 1(b).

After the resist R1 is removed, an ONO film (a three-layer film of first silicon oxide film 6 ($SiO_2$)/silicon nitride film 7 (SiN)/second silicon oxide film 8 ($SiO_2$)) is formed as an interlayer capacitive film between the floating gate electrode and the control gate electrode, as shown in FIGS. 2(a) and 2(b).

Namely, the first silicon oxide film 6 is deposited to a thickness of about 8 nm on a surface of the floating gate electrode by thermal oxidation while allowing nitrogen atoms to be contained in the interface between the tunnel oxide film 4 and the floating gate electrode and the interface between the floating gate electrode and the first silicon oxide film 6. Then, a silicon nitride film 7 is formed to a thickness of about 20 nm by CVD method and, further, the second silicon oxide film 8 is successively formed to a thickness of about 8 nm. After the ONO film is formed, a polycide film 9 is deposited to a thickness of about 100 nm as a material for the control gate electrode.

Subsequently, nitrogen is ion-implanted into the polycide film 9 at an implantation energy of about 20 keV and in a dosage of about $4\times10^{15}$ cm$^{-2}$, as shown in FIGS. 3(a) and 3(b), followed by a thermal treatment under a nitrogen atmosphere at a temperature of about 800 to about 900° C. for about 30 minutes to allow the interface between the polycide film 9 and the second silicon oxide film 8 of the ONO film to contain nitrogen.

Thereafter, the control gate electrode and the floating gate electrode are formed by reactive ion etching by using, as a mask, a resist R2 patterned by means of photolithography, as shown in FIGS. 4(a) and 4(b). Namely, the polycide film 9 as a material for the control gate electrode, the ONO film, and the polysilicon film 5 as a material for the floating gate electrode are successively removed by etching.

Then, after the resist R2 is removed, the side surface of the polysilicon film 5 as a material for the floating gate electrode is covered with a thermal oxide film 10, as shown in FIGS. 5(a) and 5(b), because the side surface of the polysilicon film 5 is exposed during the patterning of the polycide film 9 for the control gate electrode.

Subsequently, after an impurity is implanted with the control gate electrode used as a mask to form source/drain regions 11, an interlayer dielectric film 12 is deposited.

Embodiment 2

Next, an explanation is hereafter given on a process for manufacturing a non-volatile semiconductor memory device according to the second embodiment of the present invention, in which N$_2$O lower layer of the interlayer capacitive film is formed by N$_2$O oxidation method.

First, a device isolation region 2 and an active region 3 are formed of silicon oxide film to a thickness of 500 nm on a P-type semiconductor substrate 1 by LOCOS method in the same manner as in the first embodiment. Then, a tunnel oxide film 4 is formed to a thickness of about 10 nm while allowing nitrogen atoms to be contained in the surface of the semiconductor substrate 1 on the active region 3 by carrying out oxidation under N$_2$O atmosphere.

Thereafter, a polysilicon film 5 doped with phosphorus as an impurity is deposited to a thickness of about 100 nm as a material for a floating gate electrode. Then, nitrogen is implanted into the polysilicon film 5 at an implantation energy of about 20 keV and in a dosage of about $4\times10^{15}$ cm$^{-2}$. Further, the material for the floating gate electrode is etched by reactive ion etching by using, as a mask, a resist R1 patterned by means of photolithography, as shown in FIGS. 1(a) and 1(b).

Subsequently, an ONO film is formed, as shown in FIGS. 2(a) and 2(b). Namely, a first silicon oxide film 6 is formed to a thickness of about 8 nm on a surface of the floating gate electrode while allowing nitrogen atoms to be contained in the interface between the floating gate electrode and the first silicon oxide film 6 as a lower layer of the interlayer capacitive film by carrying out thermal oxidation using a known N$_2$O oxidation method, or by carrying out thermal oxidation under an oxygen atmosphere at a temperature of about 800 to about 900° C. and then carrying out an annealing treatment under a nitrogen atmosphere at a temperature of about 800 to about 900° C. Thereafter, a silicon nitride film 7 is successively deposited to a thickness of about 20 nm by CVD method and, further, a second silicon oxide film 8 is deposited to a thickness of about 8 nm. The subsequent steps are carried out in the same manner as in the first embodiment up to the formation of the interlayer dielectric film 12.

As shown above, the present invention prevents oxidation at the interface between the semiconductor substrate and the tunnel oxide film, the interface between the tunnel oxide film and the floating gate electrode, the interface between the floating gate electrode and the interlayer capacitive film and/or the interface between the interlayer capacitive film and the control gate electrode, as compared with prior art manufacturing methods. As a result, partial thickening of the interlayer capacitive film is avoided and the coupling ratio increases, so that the writing and erasing operations to the floating gate electrode by use of electrons are performed with high efficiency.

Also, by allowing the interface between the tunnel dielectric film and the substrate and the interface between the tunnel dielectric film and the floating gate electrode to contain nitrogen, it is possible to prevent thickening of the tunnel dielectric film at a portion where the floating gate electrode overlaps with the diffusion layers (source/drain regions), thereby inhibiting the decrease in writing and erasing efficiency.

Further, the present invention provides smaller influence of the thermal treatment on the thickness of the tunnel dielectric film or the interlayer capacitive film, thereby restricting the variation in the effective thickness of the tunnel dielectric film and the interlayer capacitive film, so that the present invention provides smaller variation in writing and erasing than prior art methods.

Furthermore, according as the size reduction of the devices proceeds, the effect of the present invention will increase, since the increase in the effective thickness will be more noticeable in the case of the prior art tunnel dielectric film and ONO film due to partial thickening.

Although the present invention has fully been described by way of example with reference to the accompanying drawings, it is to be understood that various changes and modifications will be apparent to those skilled in the art. Therefore, unless otherwise such changes and modifications depart from the spirit and scope of the invention, they should be construed as being included therein.

What we claim is:

1. A process for manufacturing a non-volatile semiconductor memory device by forming a tunnel dielectric film, a floating gate electrode, an interlayer capacitive film and a control gate electrode successively on a semiconductor substrate, wherein the process comprises introducing nitrogen atoms into at least an interface between the floating gate electrode and the interlayer capacitive film and an interface between the interlayer capacitive film and the control gate electrode.

2. A process for manufacturing a non-volatile semiconductor memory device according to claim 1, wherein introduction of nitrogen atoms into the interface between the tunnel dielectric film and the floating gate electrode and the interface between the floating gate electrode and the interlayer capacitive film is performed by the steps of forming the floating gate electrode on the tunnel dielectric film, then doping nitrogen atoms into the floating gate electrode, depositing the interlayer capacitive film on the floating gate electrode and carrying out a thermal treatment.

3. A process for manufacturing a non-volatile semiconductor memory device according to claim 1, wherein introduction of nitrogen atoms into the interface between the interlayer capacitive film and the control gate electrode is performed by the steps of forming the control gate electrode on the interlayer capacitive film, then doping nitrogen atoms into the control gate electrode and carrying out a thermal treatment.

4. A process for manufacturing a non-volatile semiconductor memory device according to claim 3, wherein introduction of nitrogen atoms into the interface between the tunnel dielectric film and the floating gate electrode and into the interface between the floating gate electrode and the interlayer capacitive film is performed by the steps of forming the floating gate electrode on the tunnel dielectric film, then doping nitrogen atoms into the floating gate electrode, depositing the interlayer capacitive film on the floating gate electrode and carrying out a thermal treatment.

* * * * *